US010896899B2

(12) United States Patent
Chi et al.

(10) Patent No.: US 10,896,899 B2
(45) Date of Patent: Jan. 19, 2021

(54) DISPLAY PANEL, METHOD FOR MANUFACTURING THE SAME, AND DISPLAY DEVICE

(71) Applicant: Shanghai Tianma Micro-Electronics Co., Ltd., Shanghai (CN)

(72) Inventors: Xiao Chi, Shanghai (CN); Tianyi Wu, Shanghai (CN); Jujian Fu, Shanghai (CN); Liang Xing, Shanghai (CN); Gang Liu, Shanghai (CN); Shaorong Yu, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 63 days.

(21) Appl. No.: 16/503,487

(22) Filed: Jul. 4, 2019

(65) Prior Publication Data

US 2019/0326271 A1    Oct. 24, 2019

(30) Foreign Application Priority Data

Oct. 25, 2018   (CN) .......................... 2018 1 1248855

(51) Int. Cl.
*H01L 27/14*     (2006.01)
*H01L 29/04*     (2006.01)
(Continued)

(52) U.S. Cl.
CPC ........ *H01L 25/167* (2013.01); *H01L 27/1266* (2013.01); *H01L 27/3248* (2013.01); *H01L 51/529* (2013.01)

(58) Field of Classification Search
USPC ........................................................ 257/72
See application file for complete search history.

(56) References Cited

U.S. PATENT DOCUMENTS

| 2015/0102293 A1* | 4/2015 | Cho ..................... H01L 51/5246 257/40 |
| 2018/0188579 A1* | 7/2018 | Jeong .................. G06F 3/04164 |

(Continued)

FOREIGN PATENT DOCUMENTS

| CN | 104795423 A | 7/2015 |
| CN | 106935608 A | 7/2017 |
| CN | 107104152 A | 8/2017 |

OTHER PUBLICATIONS

Office Action of Chinese Patent Application No. 201811248855.0.

*Primary Examiner* — Niki H Nguyen
(74) *Attorney, Agent, or Firm* — Kilpatrick Townsend & Stockton, LLP (57) ABSTRACT

A display panel, a method for manufacturing the display panel, and a display device including the display panel are provided. The display panel includes: a thin film transistor array layer, and a light-emitting function layer at a side of the thin film transistor array layer. The thin film transistor array layer includes a planarization layer, an electrode layer, a first insulation layer, an active layer and a buffer layer. The electrode layer includes at least one first electrode and second electrode, and each first electrode includes a connection portion and an electrode portion which are connected to each other. The light-emitting function layer includes first contact electrodes and light-emitting elements. Heat generated by the light-emitting function layer is conducted to electrode portion of the first electrode through the connection portion of the first electrode and is uniformly distributed on the connection portion and the electrode portion.

16 Claims, 8 Drawing Sheets

(51) Int. Cl.
*H01L 29/15* (2006.01)
*H01L 31/036* (2006.01)
*H01L 25/16* (2006.01)
*H01L 27/12* (2006.01)
*H01L 27/32* (2006.01)
*H01L 51/52* (2006.01)

(56) References Cited

U.S. PATENT DOCUMENTS

2019/0027548 A1* 1/2019 Jiang ................. H01L 29/66757
2019/0198802 A1* 6/2019 Lee .......................... H01L 51/56
2019/0206959 A1* 7/2019 Jung ................... H01L 27/3276

* cited by examiner

DISPLAY PANEL, METHOD FOR MANUFACTURING THE SAME, AND DISPLAY DEVICE

CROSS-REFERENCE TO RELATED APPLICATIONS

The present application claims priority to Chinese Patent Application No. 201811248855.0, filed on Oct. 25, 2018, the content of which is incorporated herein by reference in its entirety.

FIELD

The present disclosure relates to the field of display technologies, and more specifically, to a display panel, a method for manufacturing the display panel, and a display device.

BACKGROUND

With the continuous development of science and technology, more and more electronic devices with display functions are widely used in people's daily life and work, bring great convenience to people's daily life and work, and become important and indispensable tools for people nowadays.

A main component for the electronic device to implement the display function is a display panel. When the display panel is in operation, light-emitting elements on a substrate will release heat, and more light-emitting elements located on the display panel will generate more heat, causing the temperature of the light-emitting function layer of the display panel to rise, and affecting the performances of the display panel. Therefore, heat dissipation of the light-emitting function layer of the display panel is a major obstacle to the high PPI (pixels per inch, which refers to the number of pixels in one inch) of the display panel.

SUMMARY

In view of this, the present disclosure provides a display panel, a method for manufacturing the display panel, and a display device, so as to improve heat dissipation efficiency of the display panel.

In an embodiment, the present provides a display panel, and the display panel includes: a thin film transistor array layer; and a light-emitting function layer located at a side of the thin film transistor array layer. The thin film transistor array layer comprises a planarization layer, an electrode layer, a first insulation layer, an active layer, and a buffer layer; the electrode layer is located at a side of the planarization layer close to the light-emitting function layer, the first insulation layer is located at a side of the electrode layer close to the light-emitting function layer, the active layer is located at a side of the first insulation layer close to the light-emitting function layer, and the buffer layer is located at a side of the active layer close to the light-emitting function layer; the first insulation layer is provided with at least two first through holes, the electrode layer comprises at least one first electrode and at least one second electrode, the at least one first electrode and the at least one second electrode are electrically connected to the active layer through the at least two first through holes, respectively, and each of the at least one first electrode comprises a connection portion and an electrode portion which are connected to each other and made of a same material, wherein the connection portion is located in a respective first through hole, and the electrode portion is located at a side of the first insulation layer facing away from the active layer; a respective one of the at least two first through holes corresponding to one of the at least one first electrode comprises a first portion overlapping with the active layer and a second portion not overlapping with the active layer and communicated with the first portion; the light-emitting function layer comprises a plurality of first contact electrodes and a plurality of light-emitting elements, the plurality of light-emitting elements is electrically connected to the plurality of first contact electrodes, and the plurality of first contact electrodes is located at a side of the plurality of light-emitting elements close to the buffer layer; and the buffer layer is provided with at least one second through hole, and the at least one first electrode is electrically connected to the plurality of first contact electrodes through the at least one second through hole.

In another embodiment, the present disclosure provides a method for manufacturing the display panel, and the method includes: providing a substrate; arranging a sacrificial layer on the substrate; arranging a thin film transistor array layer at a side of the sacrificial layer facing away from the substrate; peeling off the substrate from the sacrificial layer; removing the sacrificial layer; and arranging a light-emitting function layer at a side of the thin film transistor array layer. The arranging a thin film transistor array layer at a side of the sacrificial layer facing away from the substrate includes: arranging a buffer film layer on the sacrificial layer; arranging an active layer on the buffer film layer; arranging a first insulation film layer at a side of the active layer facing away from the buffer film layer; patterning the first insulation film layer to form a first insulation layer having at least two first through holes; arranging an electrode layer on the first insulation layer, the electrode layer includes at least one first electrode and at least one second electrode, the at least one first electrode and the at least one second electrode are electrically connected to the active layer through the at least two first through holes, respectively, a respective one of the at least two first through holes corresponding to one of the at least one first electrode includes a first portion overlapping with the active layer and a second portion not overlapping with the active layer and communicated with the first portion; and arranging a planarization layer on the electrode layer, and the arranging a light-emitting function layer at a side of the thin film transistor array layer includes: patterning the buffer film layer to form a buffer layer having at least one second through hole; arranging a first contact electrode at a side of the buffer layer facing away from the active layer, the first contact electrode is electrically connected to the at least one first electrode through the at least one second through hole; and arranging a light-emitting element at a side of the first contact electrode facing away from the buffer layer, the light-emitting element is electrically connected to the first contact electrode.

In still another embodiment, the present disclosure provides a display device, and the display device includes the display panel described above.

BRIEF DESCRIPTION OF DRAWINGS

In order to more clearly illustrate the embodiments of the present disclosure or the related art, the accompanying drawings used for describing the embodiments or the related art are briefly described below. The drawings described below are merely a part of the embodiments of the present disclosure.

DESCRIPTION OF EMBODIMENTS

The embodiments of the present disclosure are clearly and completely described in the following with reference to the accompanying drawings. It should be clear that the described embodiments are merely part of the embodiments of the present disclosure rather than all of the embodiments.

Figure 1:
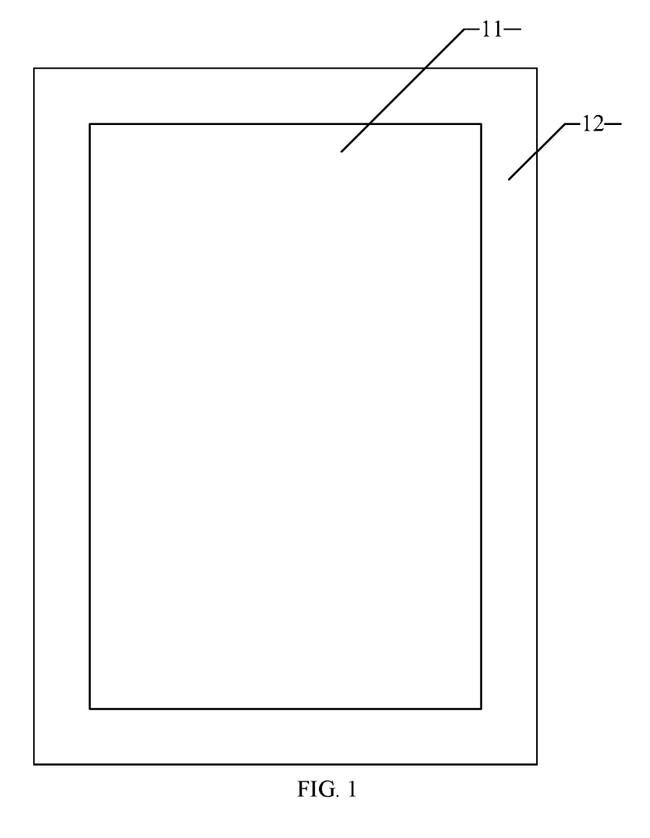
FIG. 1 is a schematic structural diagram showing a display panel in the related art.

Referring to FIG. 1, FIG. 1 is a schematic structural diagram showing a display panel in the related art. The display panel is divided into a display region 11 and a non-display region 12 surrounding the display region 11. The non-display region 12 is generally a border region of the display panel.

Specifically, the display region 11 includes a plurality of pixel units. The pixel units would release heat when in operation. More pixel unit located in the display region 11 would release more heat. If the heat is not conducted out in time, the temperature of the display panel would rise, thus affecting the performances of the display panel.

In order to improve the heat dissipation performance of the display panel, the present disclosure provides a display panel with high heat dissipation performance by modifying the structure of the display panel.

Figure 2:
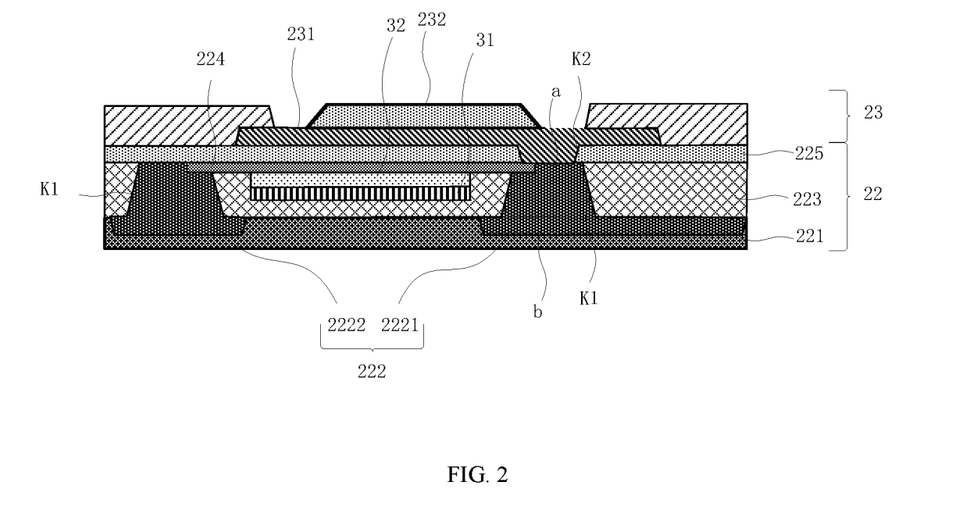
FIG. 2 is a schematic cross-sectional view of a display panel according to an embodiment of the present disclosure.

Referring to FIG. 2, FIG. 2 is a schematic cross-sectional view of a display panel according to an embodiment of the present disclosure. The display panel includes a thin film transistor array layer 22 and a light-emitting function layer 23. In the present disclosure, the structures of the thin film transistor array layer 22 and the light-emitting function layer 23 are modified to improve the heat dissipation performance of the display panel.

The structure of the thin film transistor array layer 22 disclosed in the embodiments of the present disclosure will be described below.

The thin film transistor array layer 22 includes, but is not limited to, a planarization layer 221, an electrode layer 222, a first insulation layer 223, an active layer 224, and a buffer layer 225. The electrode layer 222 is located at a side of the planarization layer 221 close to the light-emitting function layer 23. The first insulation layer 223 is located at a side of the electrode layer 222 close to the light-emitting function layer 23. The active layer 224 is located at a side of the first insulation layer 223 close to the light-emitting function layer 23. The buffer layer 225 is located at a side of the active layer 224 close to the light-emitting function layer 23.

The first insulation layer 223 has at least two first through holes K1. The buffer layer 225 has at least one second through hole K2. The electrode layer 222 includes at least one first electrode 2221 and at least one second electrode 2222.

The first electrode 2221 includes an electrode portion b and a connection portion a which are connected to each other. The electrode portion b and the connection portion a are made of a same material. The connection portion a is located in the first through hole K1, and the electrode portion b is located a side of the first insulation layer 223 facing away from the active layer 224. Each first electrode 2221 and each second electrode 2222 respectively correspond to one first through hole K1 such that the at least one first electrode 2221 and the at least one second electrode 2222 are electrically connected to the active layer 224 through the at least two first through hole K1, respectively. At least the first through hole K1 corresponding to the at least one first electrode 2221 includes a first portion overlapping the active layer 224 and a second portion not overlapping the active layer 224. The first portion and the second portion are communicated with each other such that the connection portion a in the first through hole K1 is electrically connected to the active layer 224.

Referring to FIG. 2, the thin film transistor array layer 22 may further include a gate electrode 31 and a gate insulation layer 32 which are arranged between the first insulation layer 223 and the active layer 224. The gate insulation layer 32 is arranged between the gate electrode 31 and the active layer 224.

The structure of the light-emitting function layer 23 disclosed in the embodiments of the present disclosure is described below.

The light-emitting function layer 23 includes, but is not limited to, a plurality of first contact electrodes 231 and a plurality of light-emitting elements 232. The light-emitting element 232 is electrically connected to the first contact electrode 231. The first contact electrode 231 is located a side of the light-emitting element 232 close to the buffer layer 225. The first contact electrode 231 is electrically connected to the connection portion a of the first electrode 2221 through the second through hole K2. In the embodiments of the present disclosure, the structure of the light-emitting element 232 can be set according to user's requirements. For example, in any one of the embodiments of the present disclosure, the light-emitting element 232 can be an inorganic light-emitting diode.

Referring to the above embodiments of the present disclosure, in the above structure, when the display panel is in operation, the light-emitting element 232 in the light-emitting function layer 23 releases heat, the first contact electrode 231 is connected to the first electrode 2221, and the heat released is conducted through the first contact electrode 231 and then the connection portion a of the first electrode 2221 to the electrode portion b of the first electrode 2221, forming a heat conduction path in a direction perpendicular to a plane of the display panel. Since the position at which the electrode portion b is located is far away from the light-emitting function layer 23 and close to a back side of the display panel (i.e., a side of the thin film transistor array layer 22 facing away from the light-emitting function layer 23), the heat generated by the light-emitting function layer 23 can be conducted to the position far away from the light-emitting function layer 23, which is favorable for the heat released by the light-emitting element 232 to be dissipated out from the back side of the display panel, thereby effectively improving the heat dissipation efficiency of the light-emitting function layer of the display panel.

In addition, in the above embodiments of the present disclosure, since the planarization layer 221 is located at a side of the buffer layer 225 facing away from the light-emitting function layer 23, the thin film transistor array layer can be inverted after the film layers in the thin film transistor array layer 22 are stacked sequentially from a side of the buffer layer 225 to a side of the planarization layer 221. The planarization layer 221 provides a flat supporting surface for the inverted structure to cooperate with an inverting step in a manufacturing process of the display panel so as to reduce influence on other film layers in the thin film transistor array layer. The inverted thin film transistor structure formed is advantageous for improving the heat dissipation efficiency of the display panel. Further, since the first through hole K1 includes the first portion overlapping the active layer 224 and the second portion not overlapping the active layer 224, and the first electrode 2221 is electrically connected to the first contact electrode 2221 through the second through hole K2 in the buffer layer 225, the first electrode 2221 can be directly connected to the first contact electrode 231, achieving a higher heat conduction efficiency.

Further, in the embodiments of the present disclosure, the thin film transistor array layer 22 includes a plurality of thin film transistors. The first electrode 2221 and the second electrode 2222 refer to source and drain electrodes of the thin film transistor. Specifically, which one of the first electrode 2221 and the second electrode 2222 is used as the source electrode or the drain electrode can be selected according to design requirements. For example, the first electrode 2221 is the drain electrode, and the second electrode 2222 is the source electrode; alternatively, the first electrode 2221 is the source electrode, and the second electrode 2222 is the drain electrode.

Similar to the structure of the first electrode 2221, the second electrode 2222 also includes an electrode portion and a connection portion which are connected to each other. The electrode portion of the second electrode 2222 and the connection portion of the second electrode 2222 are made of a same material. The connection portion of the second electrode 2222 is located in the first through hole K1. The electrode portion of the second electrode 2222 is located at a side of the first insulation layer 223 facing away from the active layer 224. The first through hole K1 corresponding to the second electrode 2222 may also include a first portion overlapping with the active layer 224, and a second portion not overlapping with the active layer 224, and the first and second portions of the first through hole K1 are communicated with each other, so that the connection portion of the second electrode 2222 in the first through hole K1 is electrically connected to the active layer 224.

Figure 3:
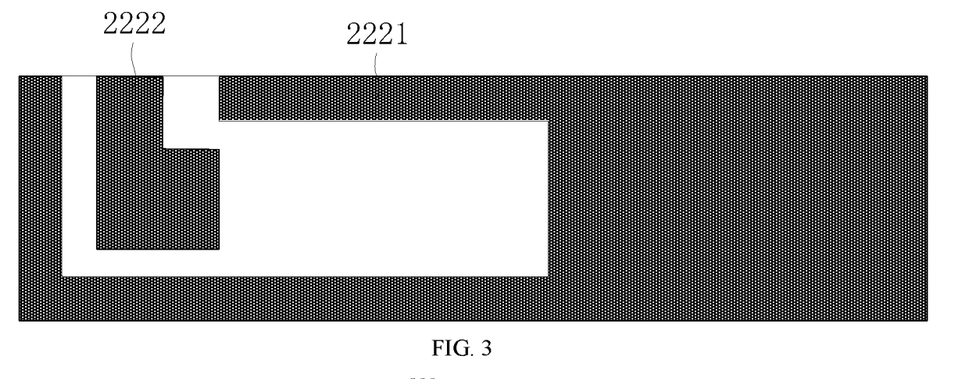
FIG. 3 is a bottom view of an electrode layer according to an embodiment of the present disclosure.

In the display panel, the first electrode 2221 is directly connected to the active layer 224 through the first through hole K1, while the second electrode 2222 needs to be connected to other components, some of which are located in the same film layer structure as the electrode portion b of the first electrode 2221. For this situation, a specific structure of the first electrode 2221 and the second electrode 2222 is also designed, so that the connection between the second electrode 2222 and other components is not influenced under the premise that the heat dissipation efficiency of the light-emitting function layer of the display panel can be improved. FIG. 3 is a bottom view of an electrode layer according to an embodiment of the present disclosure. Referring to FIG. 3, to improve the heat dissipation efficiency, the present disclosure further defines the shapes of the first electrode 2221 and the second electrode 2222, in order to increase the total amount of heat conducted by the first electrode 2221 and the second electrode 2222. In an embodiment of the present disclosure, the electrode portion b of the first electrode 2221 is shaped as a non-closed ring, and the second electrode 2222 at least includes a portion located in a same film layer structure as the electrode portion b of the first electrode 2221 and extending from a notch position of the non-closed ring into an interior of the non-closed ring. Meanwhile, since the first electrode 2221 is an open structure, the second electrode 2222 can be directly led out through the opening of the first electrode 2221 when to be connected to other components in the same layer. Therefore, it can be seen that, with such a design of the present disclosure, not only a large heat dissipation area of the first electrode 2221 is ensured, but also the connection between the second electrode 2222 and other components is not affected. Of course, if the first electrode 2221 is designed to have a closed ring structure, the second electrode 2222 can be connected to other components in the same layer by a bridge.

In the above embodiments of the present disclosure, the material of the electrode layer 222 may be any material having thermal conductivity and capable of forming a source electrode and a drain electrode. For example, the material of the electrode layer 222 may be, but not limited to, metal or graphene. The electrode layer 222 made of metal or graphene has good thermal conduction performance while maintaining characteristics of the source electrode and the drain electrode.

Figure 4:
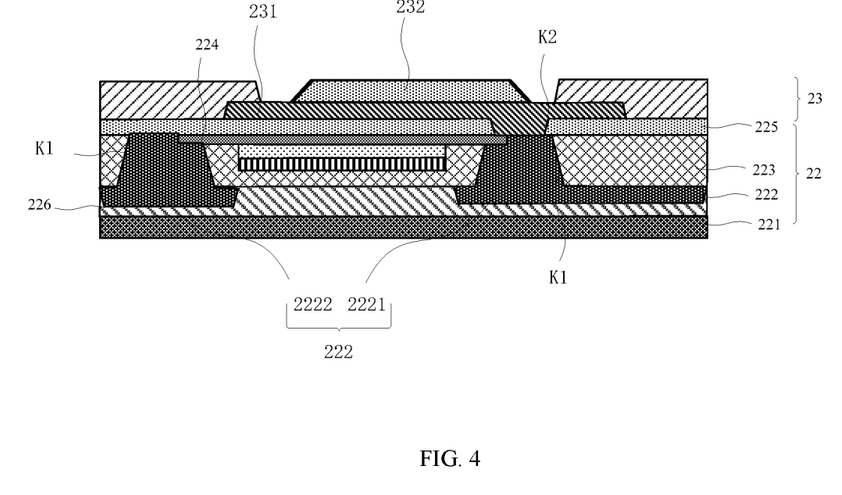
FIG. 4 is a schematic cross-sectional view of a display panel according to another embodiment of the present disclosure.

Further, referring to FIG. 4, FIG. 4 is a schematic cross-sectional view of a display panel according to another embodiment of the present disclosure. In the present embodiment of the present disclosure, in order to protect the electrode layer 222, prevent the process of manufacturing subsequent film layers from causing damage to the electrode layer 222, and prevent the electrode layer 222 from being oxidized and corroded, the thin film transistor array layer 22 may further include a passivation layer 226. The passivation layer 226 is located between the planarization layer 221 and the electrode layer 222, so as to completely isolate the electrode layer 222 from the corrosive medium, thus preventing the electrode layer 222 from coming into contact with the corrosive medium.

Figure 5:
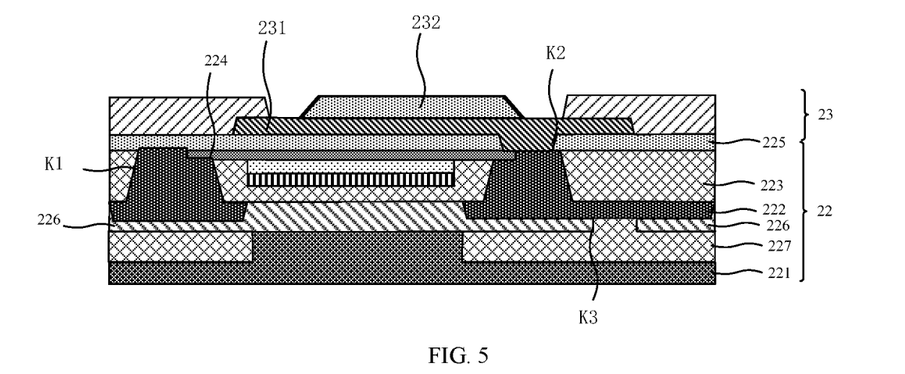
FIG. 5 is a schematic cross-sectional view of a display panel according to another embodiment of the present disclosure.

Further, in order to further improve the heat dissipation effect, the heat dissipation effect may be improved by means of a heat conduction path. The heat conduction path refers to a path along which the heat generated by the light-emitting elements is conducted to a side far away from the light-emitting elements in a direction perpendicular to the plane of the display panel. FIG. 5 is a schematic cross-sectional view of a display panel according to another embodiment of the present disclosure. Referring to FIG. 5, in the display panel disclosed in the above embodiments, the thin film transistor array layer 22 may further include a heat dissipation epitaxial layer 227. The heat dissipation epitaxial layer 227 is located at a side of the electrode layer 222 facing away from the light-emitting function layer 23, and is at least electrically connected to the first electrode 2221. When the display panel in FIG. 5 is provided with both the passivation layer 226 and the heat dissipation epitaxial layer 227, the passivation layer 226 is located between the heat dissipation epitaxial layer 227 and the electrode layer 222. In this case, it may be considered that the heat dissipation epitaxial layer 227 is located between the planarization layer 221 and the passivation layer 226. Therefore, after the passivation layer is arranged between the heat dissipation epitaxial layer 227 and the electrode layer 222, the arrangement of the heat dissipation epitaxial layer 227 will not affect the arrangement of the thin film transistor structure in the thin film transistor array layer 22, and will not affect the arrangement of the traces in the thin film transistor array layer 22, either. The heat dissipation epitaxial layer 227 can be set with a larger area, facilitating fast dissipation of the heat.

Referring to FIG. 5, a third through hole K3 may be arranged in the passivation layer 226. The heat dissipation epitaxial layer 227 at least includes a portion connected to the first electrode 2221 through the third through hole K3. That is, the heat dissipation epitaxial layer 227 may include a connection portion and a heat dissipation portion which are electrically connected. The connection portion is arranged in the third through hole K3. One end of the connection portion not connected to the heat dissipation portion is electrically connected to the first electrode 2221 through the third through hole K3 so as to conduct the heat of the electrode portion of the first electrode 2221 to the heat dissipation portion of the heat dissipation epitaxial layer 227, further reducing the temperature of the light-emitting function layer 23. Further, the area of the heat dissipation portion of the heat dissipation epitaxial layer 227 may be greater than or equal to the area of the first electrode 2221. In another embodiment of the present disclosure, the heat dissipation epitaxial layer 227 entirely covers the planarization layer 221. The material of the heat dissipation epitaxial layer 227 can be selected according to the user's requirements. In the embodiments of the present disclosure, the material of the heat dissipation epitaxial layer 227 can be selected to be a heat conductive material, more specific an insulating material with good thermal conductivity, such as aluminum nitride, hexagonal boron nitride, etc. Of course, considering manufacture costs, the heat dissipation epitaxial layer 227 can be made of metal, such as Al, Mo, and the like.

In the embodiments corresponding to FIGS. 2, 4 and 5, in order to protect the thin film transistor array layer 22 and the light-emitting function layer 23, an encapsulation film layer can be arranged at a side of the thin film transistor array layer 22 facing away from the light-emitting function layer 23. The thin film transistor array layer 22 and the light-emitting function layer 23 can be protected by the added encapsulation film layer.

Figure 6:
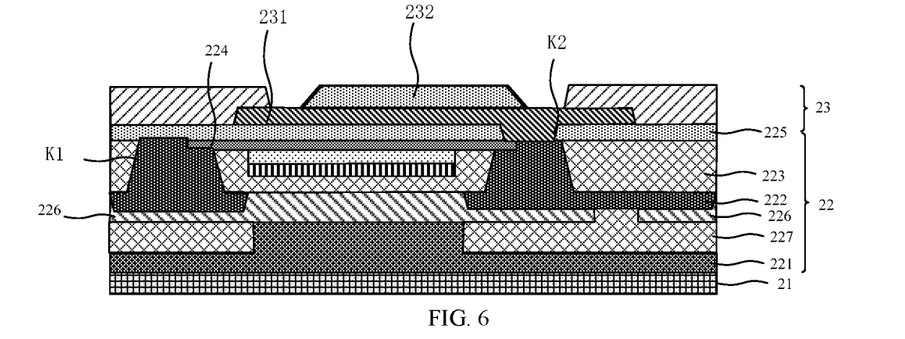
FIG. 6 is a schematic cross-sectional view of a display panel according to still another embodiment of the present disclosure.

FIG. 6 is a schematic cross-sectional view of a display panel according to still another embodiment of the present disclosure. Referring to FIG. 6, in this embodiment, the display panel may further include an encapsulation cover plate 21 arranged at a side of the thin film transistor array layer 22 facing away from the light-emitting function layer 23. Since both the electrode layer 222 and the heat dissipation epitaxial layer 227 are close to the encapsulation cover plate 21, heat can be conducted to the encapsulation cover plate 21 through the electrode layer 222 and the heat dissipation epitaxial layer 227 to form a heat conduction path. In order to conduct out the heat close to the encapsulation cover plate 21 as soon as possible so as to improve the heat dissipation efficiency of the display panel, the encapsulation cover plate 21 may adopt a heat conductive material having good thermal conductivity. The heat conductive material may be a metal material or a non-metal material. Furthermore, the encapsulation cover plate 21 may be a single layer structure or a multi-layer laminated structure. When the encapsulation cover plate 21 is a laminated structure, each of the laminated layers may be made of a metal material or a non-metal material. Alternatively, one or more layers are made of a metal material and the remaining layers are made of a non-metal material. Since the active layer is located at a side of the electrode layer 222 facing away from the encapsulation cover plate 21, even if a spacing between the encapsulation cover plate and the electrode layer is small, i.e., a thickness of the film layers between the encapsulation cover plate and the electrode layer is small, the channel characteristics of the active layer of the thin film transistor will not be affected, and the thin film transistor has a stable electrical characteristic while the heat dissipation effect is improved.

FIG. 6, merely as an example, schematically shows a structure of the display panel obtained by directly providing the encapsulation cover plate 21 on the basis of the embodiment corresponding to FIG. 5. In the present disclosure, the encapsulation cover plate 21 can be added based on the embodiment corresponding to FIGS. 2 and 4. When the encapsulation cover plate 21 is added to the embodiment corresponding to FIGS. 2 and 4, the encapsulation cover plate 21 is also arranged at a side of the thin film transistor array layer 22 facing away from the light-emitting function layer 23.

In the embodiments of the present disclosure, the buffer layer 225 includes, but is not limited to, an inorganic material layer or an organic material layer. The material of the inorganic material layer includes, but is not limited to, silicon oxide, silicon nitride, silicon oxynitride, alumina, aluminum nitride, or the like. The material of the organic material layer includes, but is not limited to, acrylic or polyimide (PI) and the like. In the display panel structure disclosed in the present disclosure, the buffer layer 225 may not play a role of planarization. Therefore, in order to improve the heat conduction efficiency, the buffer layer 225 may have a smaller thickness to facilitate the heat in the light-emitting function layer 23 to be conducted to the electrode layer through the buffer layer 225. For example, the buffer layer 225 may have a thickness between 1000 nm and 5000 nm, or a thickness less than 1000 nm.

In the existing display panel structure, the surface of the thin film transistor array layer facing the light-emitting function layer is generally not flat, that is, the surface is not a plane. In order to provide a flat surface for forming a subsequent film layer or for subsequently forming the light-emitting elements, a planarization layer is generally required to be arranged between the thin film transistor array layer and the light-emitting function layer. In order to fill a concave-convex structure at the side of the thin film transistor array layer facing the light-emitting function layer to obtain a flat surface, the planarization layer has a larger thickness, which is disadvantageous for quickly conducting heat from the through hole (configured to achieve an electrical connection between the light-emitting function layer and the thin film transistor array layer) of the planarization layer to the outside. In the embodiments of the present disclosure, since the buffer layer 225 is not required to play a role of planarization, the buffer layer 225 can be a planar structure, that is, in a direction perpendicular to the display panel, both two opposite surfaces of the buffer layer 225 are flat surfaces, and the buffer layer has a comparatively small thickness.

Figure 7:
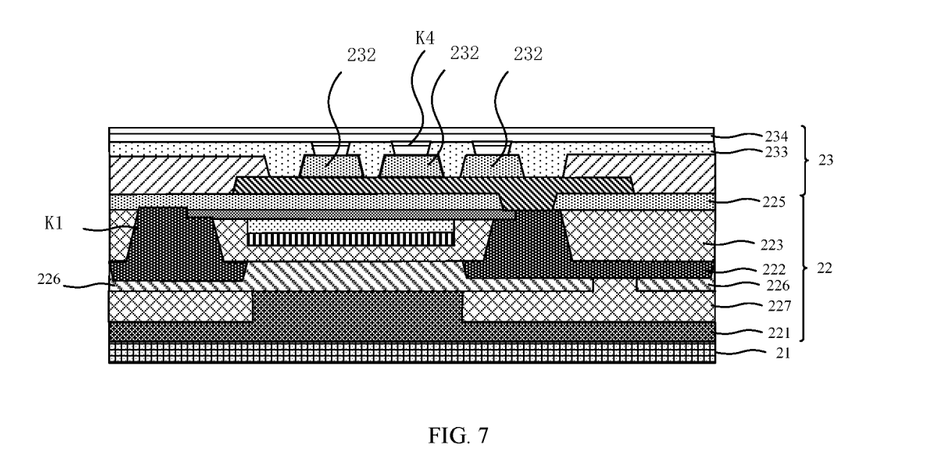
FIG. 7 is a schematic cross-sectional view of a display panel according to still another embodiment of the present disclosure.

FIG. 7 is a schematic cross-sectional view of a display panel according to still another embodiment of the present disclosure. Referring to FIG. 7, the light-emitting function layer 23 may further include a second insulation layer 233 and a second contact electrode 234. The second insulation layer 233 is located at a side of the light-emitting element 232 facing away from the buffer layer 225. The second contact electrode 234 is located at a side of the second insulation layer 233 facing away from the light-emitting element 232. A plurality of fourth through holes K4 is arranged in the second insulation layer 233. The second contact electrode 234 is electrically connected to the light-emitting element 231 through the fourth through hole K4. The second contact electrode 234 may refer to an upper electrode in the light-emitting function layer 23. The first contact electrode 231 may refer to a lower electrode in the light-emitting function layer 23.

Figure 8:
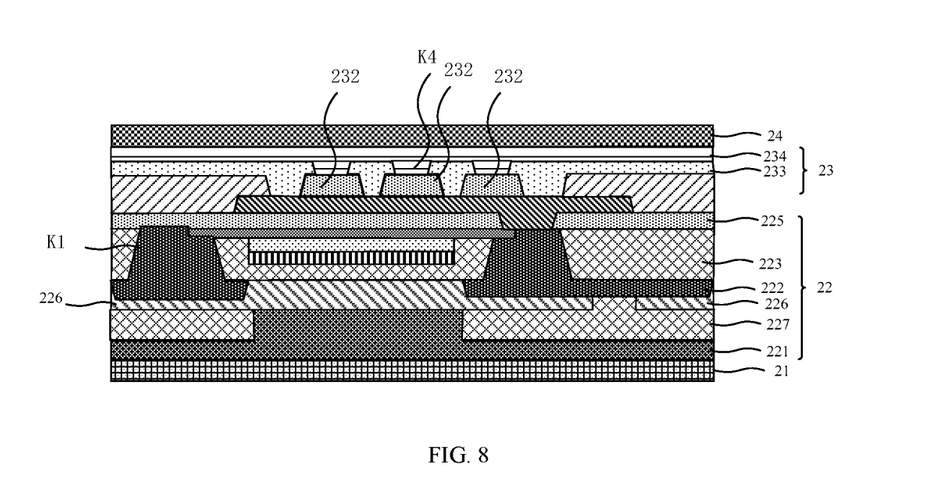
FIG. 8 is a schematic cross-sectional view of a display panel according to still another embodiment of the present disclosure.

FIG. 8 is a schematic cross-sectional view of a display panel according to still another embodiment of the present disclosure. Referring to FIG. 8, the display panel may further include an encapsulation layer 24 covering a side of the light-emitting function layer 23 facing away from the thin film transistor array layer 22.

It should be noted that, in the schematic cross-sectional views of the display panel shown in FIGS. 7 and 8, the heat dissipation epitaxial layer 227 and the encapsulation cover plate 21 are illustrated. However, in the embodiments corresponding to FIGS. 7 and 8, the heat dissipation epitaxial layer 227 and/or the encapsulation cover plate 21 may not be included in the display panel.

According to an embodiment, the encapsulation layer 24 includes a first inorganic encapsulation layer, an organic encapsulation layer and a second inorganic encapsulation layer which are arranged in that order at a side of the light-emitting function layer 23 facing away from the thin film transistor array layer. The encapsulation layer 24 may be a thin film encapsulation (TFE) layer.

One first contact electrode may correspond to one light-emitting element. Alternatively, one first electrode may correspond to a plurality of light-emitting elements. In the embodiments corresponding to FIGS. 7 and 8, one first contact electrode 231 can correspond to a plurality of light-emitting elements, that is, referring to FIGS. 7 and 8, the first contact electrode 231 is electrically connected to a plurality of light-emitting elements 232. For example, as shown in FIGS. 7 and 8, each first contact electrode 231 is electrically connected to three light-emitting elements.

Figure 9:
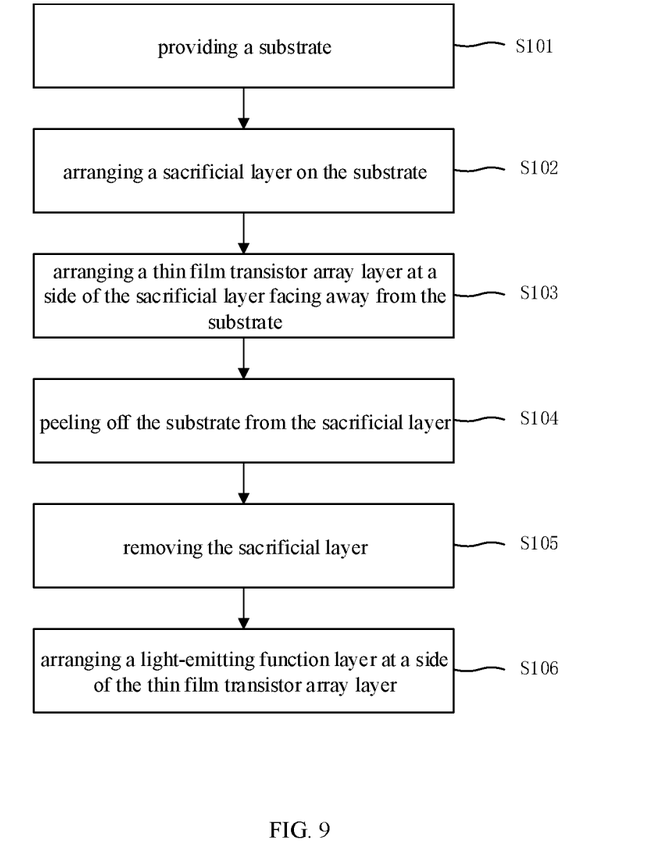
FIG. 9 is a flow chart of manufacturing a display panel according to an embodiment of the present disclosure.

Correspondingly, the present disclosure also discloses a method for manufacturing a display panel. FIG. 9 is a flow chart of manufacturing a display panel according to an embodiment of the present disclosure. Referring to FIG. 9, the method includes the following steps.

Step S101: a substrate 01 is provided.

Figure 10:
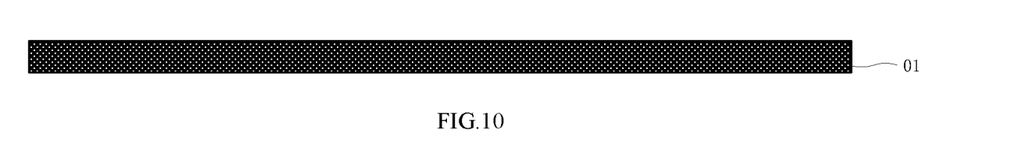
FIG. 10 is a schematic structural diagram showing a substrate according to an embodiment of the present disclosure.

Specifically, a substrate as shown in FIG. 10 is provided. FIG. 10 is a schematic structural diagram showing a substrate according to an embodiment of the present disclosure.

Figure 11:
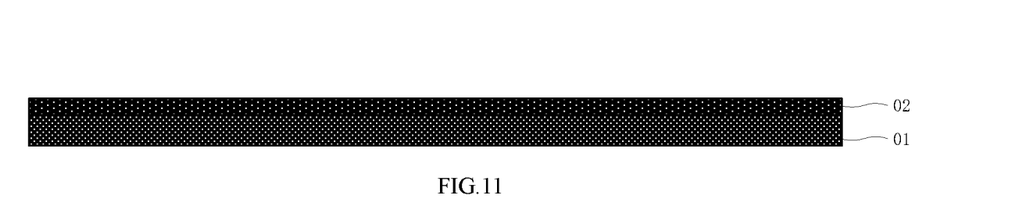
FIG. 11 is a schematic structural diagram showing an array substrate obtained by arranging a sacrificial layer on a substrate according to an embodiment of the present disclosure.

Step S102: a sacrificial layer 02 is arranged on the substrate 01 to obtain a structure as shown in FIG. 11. FIG. 11 is a schematic structural diagram showing an array substrate obtained by arranging a sacrificial layer on a substrate according to an embodiment of the present disclosure.

In this embodiment, the sacrificial layer 02 may be made of a material that can be removed. For example, it may be an organic material that can be washed away by an organic solvent. Specifically, it may be polyimide.

Figure 12:
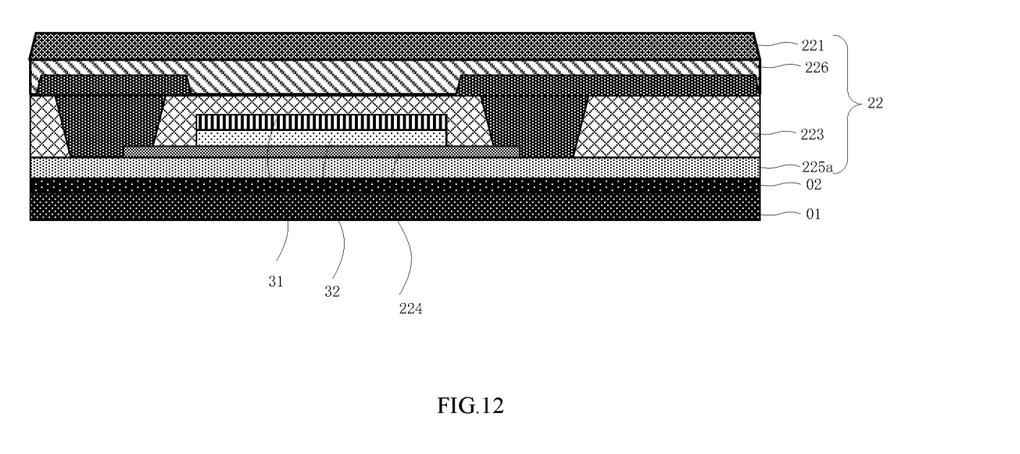
FIG. 12 is a schematic structural diagram showing an array substrate obtained by arranging a thin film transistor array layer on a sacrificial layer according to an embodiment of the present disclosure.

Step S103: a thin film transistor array layer 22 is arranged at a side of the sacrificial layer 02 facing away from the substrate to obtain an array substrate as shown in FIG. 12. FIG. 12 is a schematic structural diagram showing an array substrate obtained by arranging a thin film transistor array layer on the sacrificial layer according to an embodiment of the present disclosure. The specific structure of the thin film transistor array layer 22 can be referred to the above embodiments of the display panel in the present disclosure. As shown in FIG. 12, a buffer film layer 225a in the array substrate is equivalent to the buffer layer 225 before being etched in the above embodiments. After the buffer layer 225a is patterned in a subsequent manufacture process of the display panel, a through hole is formed so as to obtain the buffer layer 225.

Step S104: the substrate 01 is peeled off from the sacrificial layer 02. In this case, the substrate 01 can be removed by a laser stripping technology.

Figure 13:
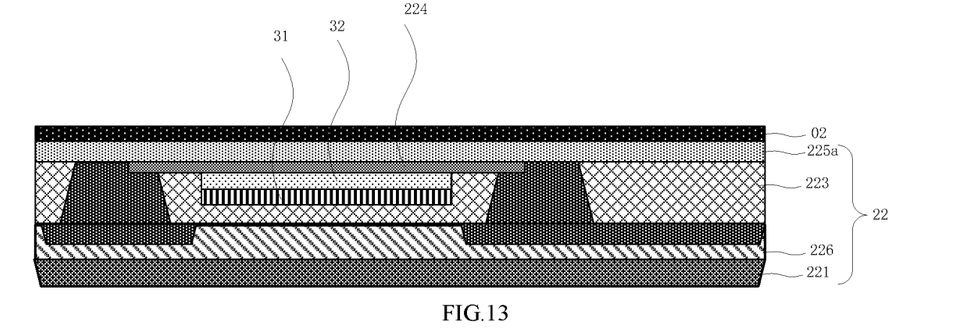
FIG. 13 is a schematic structural diagram showing an array substrate inverted after the substrate is peeled off.

In the embodiments of the present disclosure, after the substrate 01 is removed from the sacrificial layer 02, the remaining portion of the array substrate may be turned upside down, that is, the remaining portion of the array substrate is inverted so that the thin film transistor array layer 22 is inverted. At this time, operation in a next step can be conducted on a surface of the sacrificial layer 02. FIG. 13 is a schematic structural diagram showing an array substrate inverted after the substrate is peeled off. As shown in FIG. 13, the sacrificial layer 02 is located above the thin film transistor array layer 22.

Step S105: the sacrificial layer 02 is removed.

The sacrificial layer 02 may be removed by using an organic solvent cleaning method. After the sacrificial layer 02 is removed, the buffer film layer 225a in the thin film transistor array layer 22 is exposed.

Step S106: a light-emitting function layer 23 is arranged at a side of the thin film transistor array layer 22 to obtain the display panel shown in FIG. 2. The process of arranging the light-emitting function layer 23 at a side of the thin film transistor array layer 22 includes: patterning the buffer film layer to form a buffer layer 225 having at least one second through hole; arranging a first contact electrode at a side of the buffer layer 225 facing away from the active layer 224, the first contact electrode being electrically connected to the first electrode 2221 through the second through hole; and arranging a light-emitting element at a side of the first contact electrode facing away from the buffer layer 225, the light-emitting element being electrically connected to the first contact electrode. The light-emitting element may include an organic light-emitting element or an inorganic light-emitting element.

A specific structure of the light-emitting function layer 23 may refer to the above embodiments of the display panel of the present disclosure.

The process of arranging the thin film transistor array layer 22 at a side of the sacrificial layer facing away from the substrate includes: arranging a buffer film layer on the sacrificial layer; arranging an active layer 224 on the buffer film layer, arranging a first insulation film layer at a side of the active layer 224 facing away from the buffer film layer; patterning the first insulation film layer to form a first insulation layer 223 having at least two first through holes K1; arranging an electrode layer 222 on the first insulation layer 223, the electrode layer 222 including at least one first electrode 2221 and at least one second electrode 2222, the first electrode 2221 and the second electrode 2222 being electrically connected to the active layer 224 through the first through holes K1, respectively, the first through hole K1 corresponding to at least the first electrode 2221 including a first portion overlapping with the active layer 224 and a second portion not overlapping with the active layer 224, the first portion being communicated with the second portion; and arranging a planarization layer 221 on the electrode layer 222. A planarization surface is provided by the planarization layer 221. When the manufactured array substrate is inverted, the surface of the planarization layer 221 facing away from the buffer film layer can provide a flat supporting surface for the array substrate, ensuring that the position of the film layer located on the planarization layer will not change in subsequent manufacture steps.

In the above embodiments of the present disclosure, a sacrificial layer is firstly arranged on the substrate, then a thin film transistor array layer is prepared on the sacrificial layer, then the substrate and the sacrificial layer are peeled off, and finally a light-emitting function layer is arranged at a side of the thin film transistor array layer where the sacrificial layer is previously arranged to finally obtain a display panel. In the manufacturing method provided by the embodiments of the present disclosure, the sequence for manufacturing the film layers in the thin film transistor array layer has a good compatibility with the conventional process, which has a small influence on the sequence for manufacturing the film layers of the thin film transistor array layer while solving the heat dissipation problem of the display panel. When the display panel manufactured by the method of the present disclosure is in operation, the light-emitting elements in the light-emitting function layer of the display panel release heat, the released heat is conducted to the first electrode through the first contact electrode and the connection portion of the first electrode, and the heat on the first electrode is uniformly distributed on the connection portion and the electrode portion of the first electrode. Since the position where the electrode portion of the first electrode is located is far away from the light-emitting function layer, heat generated by the light-emitting function layer is conducted to a position far away from the light-emitting function layer, thus effectively improving the heat dissipation efficiency of the light-emitting function layer of the display panel, and improving the display performance of the display panel.

Figure 14:
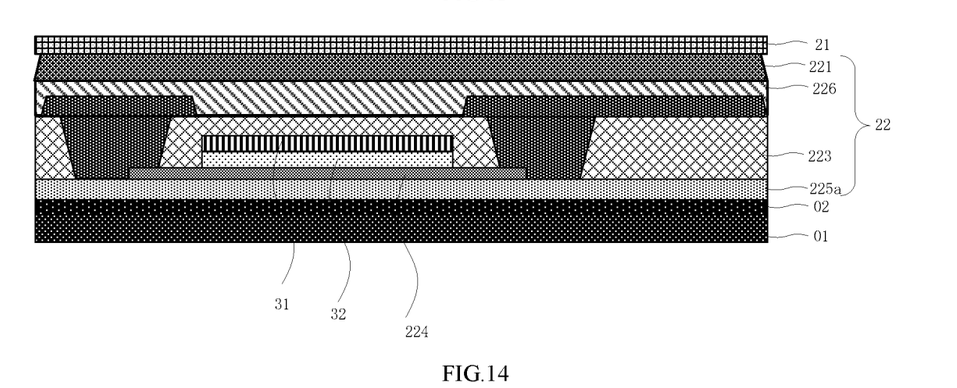
FIG. 14 is a schematic structural diagram showing an array substrate after a encapsulation cover plate is arranged.

In an embodiment of the disclosure, prior to peeling off the substrate from the sacrificial layer, the method further includes the following steps.

An encapsulation cover plate 21 is arranged at a side of the thin film transistor array layer 22 facing away from the substrate, as shown in FIG. 14, and FIG. 14 is a schematic structural diagram showing an array substrate after a encapsulation cover plate is arranged. The encapsulation cover plate 21 may be made of a metal material. After the thin film transistor array layer 22 and the light-emitting function layer 23 are arranged on the array substrate to obtain a display panel, the encapsulation cover plate is located outside the display panel and is adjacent to the thin film transistor array layer 22 so as to protect the thin film transistor array layer 22. Further, since both the electrode layer 222 of the thin film transistor array layer 22 and the heat dissipation epitaxial layer 227 are close to the encapsulation cover plate 21, heat can be conducted to the encapsulation cover plate 21 through the electrode layer 222 and the heat dissipation epitaxial layer 227 to form a heat conduction path, so that the heat close to the encapsulation cover plate 21 is conducted out as soon as possible to improve the heat dissipation efficiency of the display panel.

Figure 15:
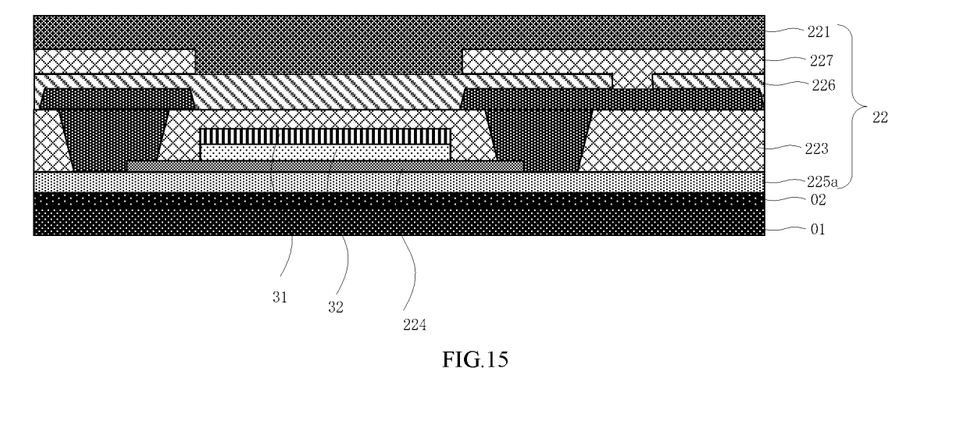
FIG. 15 is a schematic structural diagram showing an array substrate according to another embodiment of the present disclosure.

FIG. 15 is a schematic structural diagram showing an array substrate according to another embodiment of the present disclosure. Referring to FIG. 15, prior to arranging the planarization layer 221 on the electrode layer 222, the method further includes the following steps.

A passivation film layer is arranged at a side of the electrode layer 222 facing away from the first insulation layer 223, and the passivation film layer is patterned to form a passivation layer having a third through hole. A heat dissipation epitaxial layer is arranged at a side of the passivation layer facing away from the electrode layer 222. The heat dissipation epitaxial layer at least includes a portion connected to the first electrode 2221 through the third through hole. The heat dissipation epitaxial layer 227 is located between the planarization layer 221 and the passivation layer 226. Referring to FIG. 5, the passivation layer 226 is provided with a third through hole K3, the heat dissipation epitaxial layer 227 at least includes a portion connected to the first electrode 2221 through the third through hole K3, that is, the heat dissipation epitaxial layer 227 includes a connection portion and a heat dissipation portion which are electrically connected to each other, the connection portion is arranged in the third through hole K3, one end of the connection portion that is not connected to the heat dissipation portion is electrically connected to the first electrode 2221 through the third through hole K3 so as to conduct heat of the electrode portion of the first electrode 2221 to the heat dissipation portion of the heat dissipation epitaxial layer 227, further lowering the temperature of the light-emitting function layer 23. Further, the area of the heat dissipation portion of the heat dissipation epitaxial layer 227 may be greater than or equal to the area of the first electrode 2221, which is advantageous for heat dissipation of the actual panel.

In an embodiment of the present disclosure, corresponding to the above display panel embodiments, in the above method, the step of arranging the light-emitting function layer 23 at a side of the thin film transistor array layer 22 further includes: arranging a second insulation film layer at a side of the light-emitting element facing away from the first contact electrode, patterning the second insulation film layer to form a second insulation layer having a fourth through hole, and arranging a second contact electrode at a side of the second insulation layer facing away from the light-emitting element, the second contact electrode being electrically connected to the light-emitting element through the fourth through hole.

In an embodiment of the present disclosure, the step of arranging the light-emitting element at a side of the first contact electrode facing away from the buffer film layer includes: providing the light-emitting element that is an inorganic light-emitting diode; and transferring the inorganic light-emitting diode to a side of the first contact electrode facing away from the buffer film layer, so that the inorganic light-emitting diode is electrically connected to the first contact electrode.

According to another embodiment of the present disclosure, the light-emitting element may be an organic light-emitting diode (OLED). When the light-emitting diode is the OLED, the step of arranging a light-emitting element at a side of the first contact electrode facing away from the buffer film layer includes: forming a pixel definition film layer at a side of the first contact electrode facing away from the buffer film layer, and patterning the pixel definition film layer to form a pixel definition layer having a plurality of openings; forming a light-emitting layer in the openings; and generating a cathode layer on the light-emitting layer. In the display panel provided by the embodiments of the present disclosure, all of the light-emitting elements may share one cathode layer.

Correspondingly, the present disclosure also discloses a display device. The display device may include a display panel according to any one of the embodiments of the present disclosure. The display device may include, but is not limited to, a display device with a display panel, such as a mobile phone, a tablet computer, a notebook computer, a television, and the like.

By applying the display panel disclosed in any one of the above embodiments of the present disclosure to the display device, the display performance of the display device is improved.

The various embodiments in the present specification are described in a progressive manner, differences between the embodiments are focused, and the same or similar parts between the various embodiments may be referred to each other. For the device disclosed in the embodiments, since it corresponds to the method disclosed in the embodiments, the description of the device is relatively simple, and the relevant part can be referred to the method part.

What is claimed is:

1. A display panel, comprising:
    a thin film transistor array layer; and
    a light-emitting function layer located at a side of the thin film transistor array layer,
    wherein the thin film transistor array layer comprises a planarization layer, an electrode layer, a first insulation layer, an active layer, and a buffer layer; the electrode layer is located at a side of the planarization layer close to the light-emitting function layer, the first insulation layer is located at a side of the electrode layer close to the light-emitting function layer, the active layer is located at a side of the first insulation layer close to the light-emitting function layer, and the buffer layer is located at a side of the active layer close to the light-emitting function layer;
    the first insulation layer is provided with at least two first through holes, the electrode layer comprises at least one first electrode and at least one second electrode, the at least one first electrode and the at least one second electrode are electrically connected to the active layer through the at least two first through holes, respectively, and each of the at least one first electrode comprises a connection portion and an electrode portion which are connected to each other and made of a same material, wherein the connection portion is located in a respective first through hole, and the electrode portion is located at a side of the first insulation layer facing away from the active layer;
    a respective one of the at least two first through holes corresponding to one of the at least one first electrode comprises a first portion overlapping with the active layer and a second portion not overlapping with the active layer and communicated with the first portion;
    the light-emitting function layer comprises a plurality of first contact electrodes and a plurality of light-emitting elements, the plurality of light-emitting elements is electrically connected to the plurality of first contact electrodes, and the plurality of first contact electrodes is located at a side of the plurality of light-emitting elements close to the buffer layer; and
    the buffer layer is provided with at least one second through hole, and the at least one first electrode is electrically connected to the plurality of first contact electrodes through the at least one second through hole.

2. The display panel according to claim 1, wherein each of the at least one first electrode is shaped as a non-closed ring, and each of the at least one second electrode at least comprises a portion extending from a notch position of the non-closed ring into an interior of the non-closed ring.

3. The display panel according to claim 1, wherein the electrode layer is made of metal or graphene.

4. The display panel according to claim 1, further comprising:
    a heat dissipation epitaxial layer, wherein the heat dissipation epitaxial layer is located at a side of the electrode layer facing away from the light-emitting function layer, and is at least electrically connected to the at least one first electrode; and
    the heat dissipation epitaxial layer is made of a heat conductive material.

5. The display panel according to claim 4, further comprising:
    a passivation layer located between the heat dissipation epitaxial layer and the electrode layer, wherein the passivation layer is provided with a third through hole, and the heat dissipation epitaxial layer further comprises a portion connected to the at least one first electrode through the third through hole.

6. The display panel according to claim 1, further comprising: an encapsulation cover plate arranged at a side of the thin film transistor array layer facing away from the light-emitting function layer, wherein the encapsulation cover plate is made of a heat conductive material.

7. The display panel according to claim 6, wherein the material of the encapsulation cover plate comprises a metal material or a non-metal material.

8. The display panel according to claim 6, wherein the encapsulation cover plate has a single layer structure or a multi-layer laminated structure.

9. The display panel according to claim 1, wherein each of the plurality of light-emitting elements is an inorganic light-emitting diode.

10. The display panel according to claim 9, further comprising:
    a second insulation layer located at a side of the inorganic light-emitting diode facing away from the buffer layer, the second insulation layer being provided with a fourth through hole; and
    a second contact electrode located at a side of the second insulation layer facing away from the inorganic light-emitting diode and electrically connected to the inorganic light-emitting diode through the fourth through hole.

11. A method for manufacturing a display panel, comprising:
providing a substrate;
arranging a sacrificial layer on the substrate;
arranging a thin film transistor array layer at a side of the sacrificial layer facing away from the substrate;
peeling off the substrate from the sacrificial layer;
removing the sacrificial layer; and
arranging a light-emitting function layer at a side of the thin film transistor array layer,
wherein said arranging a thin film transistor array layer at a side of the sacrificial layer facing away from the substrate comprises: arranging a buffer film layer on the sacrificial layer; arranging an active layer on the buffer film layer; arranging a first insulation film layer at a side of the active layer facing away from the buffer film layer; patterning the first insulation film layer to form a first insulation layer having at least two first through holes; arranging an electrode layer on the first insulation layer, wherein the electrode layer comprises at least one first electrode and at least one second electrode, the at least one first electrode and the at least one second electrode are electrically connected to the active layer through the at least two first through holes, respectively, a respective one of the at least two first through holes corresponding to one of the at least one first electrode comprises a first portion overlapping with the active layer and a second portion not overlapping with the active layer and communicated with the first portion; and arranging a planarization layer on the electrode layer, and
said arranging a light-emitting function layer at a side of the thin film transistor array layer comprises: patterning the buffer film layer to form a buffer layer having at least one second through hole; arranging a first contact electrode at a side of the buffer layer facing away from the active layer, wherein the first contact electrode is electrically connected to the at least one first electrode through the at least one second through hole; and arranging a light-emitting element at a side of the first contact electrode facing away from the buffer layer, wherein the light-emitting element is electrically connected to the first contact electrode.

12. The method for manufacturing the display panel according to claim 11, further comprising, prior to peeling off the substrate from the sacrificial layer:
arranging an encapsulation cover plate at a side of the thin film transistor array layer facing away from the substrate, wherein the encapsulation cover plate is made of a heat conductive material.

13. The method for manufacturing the display panel according to claim 11, further comprising, prior to arranging a planarization layer on the electrode layer:
arranging a passivation film layer at a side of the electrode layer facing away from the first insulation layer; patterning the passivation film layer to form a passivation layer having a third through hole; and arranging a heat dissipation epitaxial layer at a side of the passivation layer facing away from the electrode layer, wherein the heat dissipation epitaxial layer at least comprises a portion connected to the at least one first electrode through the third through hole.

14. The method for manufacturing the display panel according to claim 11, wherein said arranging a light-emitting function layer at a side of the thin film transistor array layer further comprises:

arranging a second insulation film layer at a side of the light-emitting element facing away from the first contact electrode; patterning the second insulation film layer to form a second insulation layer having a fourth through hole; and arranging a second contact electrode at a side of the second insulation layer facing away from the light-emitting element, wherein the second contact electrode is electrically connected to the light-emitting element through the fourth through hole.

15. The method for manufacturing the display panel according to claim 11, wherein said arranging a light-emitting element at a side of the first contact electrode facing away from the buffer film layer comprises:
providing a light-emitting element that is an inorganic light-emitting diode; and
transferring the inorganic light-emitting diode to the side of the first contact electrode facing away from the buffer film layer.

16. A display device, comprising a display panel, wherein the display panel comprises:
a thin film transistor array layer; and
a light-emitting function layer located at a side of the thin film transistor array layer,
wherein the thin film transistor array layer comprises a planarization layer, an electrode layer, a first insulation layer, an active layer, and a buffer layer; the electrode layer is located at a side of the planarization layer close to the light-emitting function layer, the first insulation layer is located at a side of the electrode layer close to the light-emitting function layer, the active layer is located at a side of the first insulation layer close to the light-emitting function layer, and the buffer layer is located at a side of the active layer close to the light-emitting function layer;
the first insulation layer is provided with at least two first through holes, the electrode layer comprises at least one first electrode and at least one second electrode, the at least one first electrode and the at least one second electrode are electrically connected to the active layer through the at least two first through holes, respectively, and each of the at least one first electrode comprises a connection portion and an electrode portion which are connected to each other and made of a same material, wherein the connection portion is located in a respective first through hole, and the electrode portion is located at a side of the first insulation layer facing away from the active layer;
a respective one of the at least two first through holes corresponding to one of the at least one first electrode comprises a first portion overlapping with the active layer and a second portion not overlapping with the active layer and communicated with the first portion;
the light-emitting function layer comprises a plurality of first contact electrodes and a plurality of light-emitting elements, the plurality of light-emitting elements is electrically connected to the plurality of first contact electrodes, and the plurality of first contact electrodes is located at a side of the plurality of light-emitting elements close to the buffer layer; and
the buffer layer is provided with at least one second through hole, and the at least one first electrode is electrically connected to the plurality of first contact electrodes through the at least one second through hole.

* * * * *